United States Patent
Toben et al.

(10) Patent No.: US 7,357,853 B2
(45) Date of Patent: Apr. 15, 2008

(54) ELECTROPLATING COMPOSITE SUBSTRATES

(75) Inventors: Michael P. Toben, Smithtown, NY (US); Neil D. Brown, Merrick, NY (US); Angelo Chirafisi, Howard Beach, NY (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 230 days.

(21) Appl. No.: 10/913,936

(22) Filed: Aug. 6, 2004

(65) Prior Publication Data

US 2005/0199506 A1 Sep. 15, 2005

Related U.S. Application Data

(60) Provisional application No. 60/494,077, filed on Aug. 8, 2003.

(51) Int. Cl.
C25D 3/60 (2006.01)
C25D 3/32 (2006.01)

(52) U.S. Cl. ............... 205/253; 205/302; 205/303

(58) Field of Classification Search ........... 205/253, 205/302, 303
See application file for complete search history.

(56) References Cited

U.S. PATENT DOCUMENTS

| | | | |
|---|---|---|---|
| 3,926,749 A | 12/1975 | Passal | 204/43 S |
| 4,242,182 A * | 12/1980 | Popescu | 205/303 |
| 4,574,094 A | 3/1986 | DeLuca et al. | 427/96 |
| 4,582,576 A | 4/1986 | Opaskar et al. | 204/44.4 |
| 4,589,962 A | 5/1986 | Sajja et al. | 204/15 |
| 4,599,149 A | 7/1986 | Nobel et al. | 204/44.4 |
| 4,604,299 A | 8/1986 | DeLuca et al. | 427/98 |
| 4,617,097 A | 10/1986 | Nobel et al. | 204/44.4 |
| 4,640,746 A | 2/1987 | Nobel et al. | 204/15 |
| 4,666,744 A | 5/1987 | DeLuca et al. | 427/304 |
| 4,681,670 A | 7/1987 | Nobel et al. | 204/44.4 |
| 4,701,352 A | 10/1987 | DeLuca et al. | 427/98 |
| 4,959,278 A | 9/1990 | Shimauchi et al. | 428/642 |
| 5,075,463 A | 12/1991 | Kuo et al. | 552/299 |
| 5,206,052 A | 4/1993 | Nakaso et al. | 427/97 |
| 5,415,798 A | 5/1995 | Pease et al. | 252/142 |
| 5,443,714 A | 8/1995 | Schmidt et al. | 205/241 |
| 5,554,211 A | 9/1996 | Bokisa et al. | 106/1.22 |
| 5,618,402 A | 4/1997 | Sakurai et al. | 204/244 |
| 5,759,381 A | 6/1998 | Sakurai et al. | 205/253 |
| 6,030,516 A | 2/2000 | O'Driscoll | 205/302 |
| 6,099,713 A | 8/2000 | Yanada et al. | 205/253 |
| 6,176,996 B1 | 1/2001 | Moon | 205/254 |
| 6,210,556 B1 | 4/2001 | Toben et al. | 205/253 |
| 6,217,738 B1 | 4/2001 | O'Driscoll | 205/302 |
| 6,221,427 B1 | 4/2001 | Wen et al. | 427/96 |
| 6,245,208 B1 | 6/2001 | Ivey et al. | 205/248 |
| 6,322,686 B1 | 11/2001 | Brown et al. | 205/253 |
| 6,331,240 B1 | 12/2001 | Tsunoda et al. | 205/254 |
| 6,381,118 B1 * | 4/2002 | Yokoyama et al. | 361/308.1 |
| 6,436,269 B1 * | 8/2002 | Opaskar et al. | 205/253 |
| 6,478,944 B1 | 11/2002 | Ishiyama | 205/102 |
| 6,500,327 B1 | 12/2002 | Saitoh et al. | 205/252 |
| 6,508,927 B2 | 1/2003 | Yanada et al. | 205/241 |
| 6,562,220 B2 | 5/2003 | Gillman et al. | 205/239 |
| 6,579,474 B2 | 6/2003 | McCormack et al. | 252/512 |
| 6,911,138 B2 * | 6/2005 | Motoki et al. | 205/253 |
| 2002/0104763 A1 | 8/2002 | Yanada et al. | 205/241 |
| 2003/0052014 A1 | 3/2003 | Motoki et al. | 205/302 |

FOREIGN PATENT DOCUMENTS

| | | |
|---|---|---|
| AU | B-60389/86 | 7/1986 |
| EP | 0 196 232 B1 | 11/1991 |
| EP | 0 797 690 B1 | 10/1997 |
| EP | 0 715 003 B1 | 5/2001 |
| JP | 5-195283 | 8/1993 |
| JP | 8-260186 | 10/1996 |
| JP | 10/298793 | 11/1998 |
| JP | 11-1792 | 1/1999 |
| JP | 11-343578 | 12/1999 |
| JP | 2000-26991 | 1/2000 |
| JP | 2000-87252 | 3/2000 |
| JP | 2000080493 A * | 3/2000 |
| JP | 2003-27277 | 1/2003 |
| RU | 1810398 A1 | 4/1993 |
| WO | WO 86/02389 | 4/1986 |

* cited by examiner

Primary Examiner—Edna Wong
(74) Attorney, Agent, or Firm—John J. Piskorski

(57) ABSTRACT

An electrolyte employed to selectively deposit a tin or tin alloy film on a composite substrate. A method for depositing the tin or tin alloy on the composite substrate also is described.

16 Claims, No Drawings

ELECTROPLATING COMPOSITE SUBSTRATES

This application claims the benefit of U.S. Provisional Application(s) No(s).: 60/494,077 Aug. 8, 2003.

BACKGROUND OF THE INVENTION

The present invention is directed to a composition and method of selectively electroplating a tin or tin alloy on a composite substrate having metallic portions and ceramic portions without loss of adhesion between the metal and ceramic portions. More specifically, the present invention is directed to a composition and method of selectively electroplating a tin or tin alloy on a composite substrate having metallic portions and ceramic portions without loss of adhesion between the metal and ceramic portions where the composition has components that do not compromise adhesion between the metallic and ceramic interface.

The electronic components industry is continually searching for new composite materials for use in electronic components. Such new materials are being developed in accordance with the need for miniaturized parts, which are capable of performing various operations.

Many of these composite materials include metallic portions, which alone may be easily electroplated utilizing state of the art electroplating baths. When such electroplatable portions are combined in a composite material in combination with a non-conductive, non-electroplatable portion such as a ceramic, selectively electroplating the metallic portions without affecting the ceramic portions becomes very difficult. For example, when tin/lead fluoroborate electroplating baths are utilized to achieve selective plating, the fluoroboric acid attacks the ceramic portions of the composite substrate. This attack may be in the form of solubilizing (i.e., etching or dissolving the ceramic material) or cracking. The undesired etching may result in the tin/lead alloy depositing on the ceramic, thus causing a short circuit of the metallic (electroplatable) portions.

Many tin/lead electrolytes, which are not based on fluoroborates, also are not suitable for electroplating composite materials. While non-fluoroborate baths do not cause cracking of the ceramic portions, they deposit tin/lead alloys upon such portions, thus causing short-circuiting of the metallic portions.

One type of electronic component, which utilizes a composite structure, is a dual inline package (DIP). Such components may be prepared by adhereing a die or chip to a surface and connecting the circuitry to a plurality of pins. The die is then encapsulated with ceramic pieces that are adhered together with a soft lead oxide glass containing 50% lead oxide that melts at relatively low temperatures. The soft glass binder used to encapsulate the circuit oozes around these pieces and hardens during the fabrication to become part of the package. The structure is composed of metallic pins, the encapsulating ceramic, and the hardened soft lead oxide glass encapsulation. In order to continue processing of these packages, the metallic portion (usually an iron-nickel alloy) is electroplated to facilitate soldering connection to the pins.

The common practice in the industry was to plate these DIPs with pure tin from a solution containing stannous sulfate and sulfuric acid, since the soft lead oxide glass portions do not accept a tin deposit from such solutions, nor do such electroplating solutions adversely affect the soft lead glass portions. Pure tin electrodeposits, however, have been known to produce whiskers, which grow out from the surface of various directions. These whiskers have the appearance of very fine hairs of tin metal, which can bridge adjacent metal parts and cause a short circuit.

Attempts have been made to electroplate DIPs with a tin/lead alloy containing more than 5% lead or more, since such tin/lead alloys do not have a tendency to form whiskers. However, such electroplating baths may not be used for many composite substrates such as those having a softlead glass binder. Such binders become electroplated, thus causing short-circuiting. Additionally they are soluble or are otherwise adversely affected by such plating baths.

The problems with selectively plating DIPs was addressed and solved as described in U.S. Pat. No. 4,640,746 to Nobel et al. The patent discloses a tin or tin/lead alloy electroplating bath containing a wide variety of complexing agents to maintain tin and lead materials in solution, an imidazoline compound, an alkylene oxide as well as grain refiners or brighteners and pH adjusters such as sodium or potassium hydroxide and ammonia or an ammonium salt. Preferred complexing agents are sodium gluconate, potassium pyrophosphate, potassium sodium tartrate, ammonium citrate, hydroxy ethylidene diphosphonic acid, nitrilo tri-methyl phosphonic acid, and hydroxy acetic acid or one or more of their salts. The pH at which the bath is employed is 1.5 to 5.5. The electroplating bath selectively plated the metallic portions of the DIPs without causing bridging or short-circuiting between adjacent spaced metallic portions. However, portions of the lead oxide glass ceramic were still solubilized. This effect was within acceptable limits of the industry for DIPs.

However, acceptable limits vary depending on the substrate to be electroplated and its function in an electrical device. Tolerable dissolution of ceramic material for DIPs may be unsatisfactory for many electronic components such as for embedded passives, i.e. capacitors or resistors where optimum adhesion between a metal and a ceramic material is critical to electronic performance. Further, as the electronics industry continues to miniaturize electronic devices and components the industry demands further reduction of defects. While the tin and tin/lead alloy electroplating baths of the Nobel patent were affective in the manufacture of DIPs, the baths were found to compromise adhesion between metal pastes and ceramics at their interface.

Another type of electrical component that utilizes a composite structure is the multilayer ceramic chip capacitor (MLCC). The construction of a MLCC comprises a ceramic block with embedded, inter-digitated electrodes. The electrode surfaces are exposed at the two opposite ends of the ceramic block, where contact is made by the application and high temperature firing of a conductive paste. This forms what are referred to as the terminations. The inner layer electrodes in the ceramic block can vary from a few to a few hundred.

There are two primary types of MLCC's commonly referred to as precious metal electrode (PME) MLCC's and base metal electrode (BME) MLCC's. In PME MLCC's the inner electrodes are either pure palladium or mixtures of palladium and silver. The high temperature fired conductive paste, which forms the terminations is silver based. Sometimes it also contains palladium. In the case of BME MLCC's, the inner electrodes are nickel or mixtures of nickel and copper, and the conductive paste is copper based. The final step in making both BME and PME MLCCs' is to tin or tin-lead plate the terminations to provide a solderable surface for assembly of chip capacitors to printed circuit boards.

Because of the relative price of palladium versus nickel and copper, there is a desire of MLCC manufacturers to utilize BME methodologies. Many MLCC suppliers are in full production with BME products.

Conductive pastes, as described above, at the terminations of base metal electrodes for multilayer ceramic chip capacitors often de-adhere from the BME in tin plating electrolytes. The pH of many tin electrolytes is kept above 3 to minimize attack of the ceramic chip. The terminations on the BMEs often "lift" or de-adhere after they are exposed to the electrolyte. The "lifting" has been associated with certain organic complexing agents, such as organic acids, added to the tin electrolyte in order to keep stannous tin in solution at pH 2 and above. Accordingly, there is a need for an improved tin and tin/alloy electroplating bath that does not compromise adhesion between metal pastes and ceramic materials.

SUMMARY OF THE INVENTION

The present invention is directed to a composition including one or more sources of tin or tin alloy, the source of tin is stannous organic sulfonate, stannous sulfate, stannous gluconate, stannous citrate, stannous lactate, stannous halides or mixtures thereof; at least one surfactant which is an alcohol ethoxylate; one or more aromatic diols; and one or more compounds having a general formula:

HOOCBCOOH (1)

where B is a chemical bond or $(-CH_2-)_n$ and n is an integer of from 1 to 4, a salt of the compound or an ester thereof, the compound, salt or ester thereof is in an amount of from 15 gm/L to 55 gm/L.

In another embodiment the present invention is directed to a composition including one or more sources of tin or tin alloy, the source of tin is stannous organic sulfonate, stannous sulfate, stannous gluconate, stannous citrate, stannous lactate, stannous halides or mixtures thereof; at least one surfactant which is an alcohol ethoxylate; one or more aromatic diols; and one or more compounds having a general formula:

HOOCBCOOH (1)

where B is a chemical bond or $(-CH_2-)_n$ and n is an integer of from 1 to 4, a salt of the compound or an ester thereof, the compound, salt or ester thereof is in an amount of from 20 gm/L to 45 gm/L.

In a further embodiment the composition may include one or more grain refiners or brighteners or other optional adjuvants.

In an additional embodiment the present invention is directed to a method of selectively electroplating a composite substrate composed of a metallized portion and a ceramic portion. The method includes contacting a composite substrate with a composition including one or more sources of tin or tin alloy, the source of tin is stannous organic sulfonate, stannous sulfate, stannous gluconate, stannous citrate, stannous lactate, stannous halides or mixtures thereof; one or more aromatic diols; at least one surfactant which is an alcohol ethoxylate; and one or more compounds having a formula:

HOOCBCOOH (1)

where B is a chemical bond or $(-CH_2-)_n$ where n is an integer of 1 to 4, or a salt or ester thereof and is in an amount of from 15 gm/L to 55 gm/L of the composition; and generating a sufficient amount of electrical current to selectively deposit a tin or tin alloy on metallized portions of the composite substrate.

In still another embodiment the invention is directed to a method of forming terminations on base metal electrodes of a composite substrate including coating one or more terminations of a base metal electrode with a conductive base metal paste; firing the conductive base metal paste; depositing a base metal or base metal alloy on the fired conductive paste; and depositing a tin or tin alloy on the base metal or base metal alloy using a tin or tin alloy electrolyte including one or more sources of tin or tin alloy, the source of tin is stannous organic sulfonate, stannous sulfate, stannous gluconate, stannous citrate, stannous lactate, stannous halides or mixtures thereof; at least one surfactant which is an alcohol ethoxylate; one or more aromatic diols; and one or more compounds having a formula:

HOOCBCOOH (1)

where B is a chemical bond or $(-CH_2-)_n$ and n is an integer of from 1 to 4, a salt of the compound or an ester thereof, the compound, salt or ester thereof is in an amount of from 15 gm/L to 55 gm/L.

Tin or tin alloys selectively deposited on metallized portions of composite substrates have good adhesion in contrast to tin or tin alloys deposited from many conventional baths and by conventional methods.

DETAILED DESCRIPTION OF THE INVENTION

As used throughout the specification, the following abbreviations have the following meaning, unless the context clearly indicates otherwise: ° C.=degrees Centigrade; gm=grams; L=liter; mL=milliliter; mm=millimeter; A=amperes; dm=decimeter; μm=micron=micrometer; terms "electroplating", "plating" and "depositing" are used interchangeably throughout the specification; terms "printed wiring board" and "printed circuit board" are used interchangeably throughout the specification; "film" and "layer" are used interchangeably throughout the specification. All numerical ranges are inclusive and combinable in any order, except where it is logical that such numerical ranges are construed to add up to 100%.

Compositions of the present invention include one or more sources of tin or one or more sources of tin alloy, the source of tin is stannous organic sulfonate, stannous sulfate, stannous gluconate, stannous citrate, stannous lactate, stannous halides or mixtures thereof; one or more aromatic diols; at least one surfactant which is an ethoxylated alcohol; and one or more compounds having a general formula:

HOOCBCOOH (1)

where B is a chemical bond or $(-CH_2-)_n$ and n is an integer of from 1 to 4, the compound of formula (1) is in an amount such as from 15 gm/L to 55 gm/L or such as from 20 gm/L to 45 gm/L or such as from 25 gm/L to 40 gm/L of the composition; Compounds having formula (1) consist of oxalic acid, malonic acid, succinic acid, glutaric acid and adipic acid. Typically malonic acid, glutaric acid and their salts and esters are employed. More typically malonic acid and its salts and esters are employed. Most typically malonic acid and its salts are employed to practice the invention.

Examples of suitable sources of tin include stannous organic sulfonate such as stannous methanesulfonate, stannous sulfate, stannous gluconate, stannous citrate, stannous lactate or mixtures thereof. Examples of other suitable tin salts include stannous halides such as stannous bromide and stannous chloride, such as stannous chloride dihydrate. Many of such stannous salts are commercially available. Content of the stannous salt, based on the converted amount into the weight of $Sn^{2+}$, may be in the range such as from 1 gm/L to 150 gm/L or such as from 5 gm/L to 30 gm/L.

When a tin alloy is electroplated on a composite substrate the foregoing stannous salts in the amounts disclosed may be employed in the composition along with one or more sources of metals such as lead, bismuth, copper, silver, indium, and antimony to form alloys of tin/lead, tin/bismuth, tin/copper, tin/silver, tin/indium and tin/antimony. The amounts of tin and the alloying metal may vary in the tin alloy. Tin may be the predominant metal, or the alloying metal may predominate. When the alloying metal predominates, the alloying metal is in an amount of from greater than 50% by weight to 95% by weight of the alloy or such as from 60% by weight to 80% by weight of the alloy. Typically the alloys are tin rich where the amount of tin ranges such as from greater than 50% by weight to 99% by weight of the alloy.

Suitable sources of silver metal include, but are not limited to, silver salts such as silver alkanesulfonates, silver sulfate, silver chloride, silver gluconate, silver citrate, silver lactate, silver nitrate or mixtures thereof. Content of the silver salt, based on the converted amount into the weight of $Ag^+$, may be in a range such as from 0.01 gm/L to 50 gm/L or such as from 1 gm/L to 5 gm/L.

Suitable lead salts include, but are not limited to, lead alkansulfonates, lead nitrate, lead acetate or mixtures thereof. Content of the lead salt, based on the converted amount into the weight of $Pb^{2+}$, may be in a range such as from 0.1 gm/L to 75 gm/L or such as from 1 gm/L to 10 gm/L.

Suitable copper salts include, but are not limited to, cuprous salts or cupric salts. Cuprous salts ($Cu^+$) include, for example, cuprous oxide, cuprous chloride, cuprous bromide, cuprous iodide, cuprous thiocyanate or mixtures thereof. Cupric salts ($Cu^{2+}$) include, for example, cupric organosulfate (such as cupric methanesulfonate), cupric sulfate, cupric chloride, cupric bromide, cupric iodide, cupric oxide, cupric phosphate, cupric pyrophosphate, cupric acetate, cupric citrate, cupric gluconate, cupric tartrate, cupric lactate, cupric succinate, cupric sulfamate, cupric borofluoride, cupric formate, cupric silicofluoride, or mixtures thereof. Content of the copper salt, based on the converted amount into the weight of $Cu^+$ or $Cu^{2+}$, may be in the range of 0.01 gm/L to 100 gm/L or such as from 1 gm/L to 30 gm/L.

Suitable bismuth salts include, but are not limited to, bismuth nitrate, bismuth acetate, bismuth tartrate or mixtures thereof. Content of the bismuth salt, based on the converted amount into the weight of $Bi^{3+}$, may be in the range of 1 gm/L to 100 gm/L or such as from 10 gm/L to 50 gm/L.

Suitable indium salts include, but are not limited to, indium chloride, indium sulfate, indium alkanesulfonates, or mixtures thereof. Content of the indium salt, based on the converted amount into the weight of $In^{3+}$, may be in the range of 0.1 gm/L to 100 gm/L or such as from 1 gm/L to 20 gm/L.

Suitable antimony salts include, but are not limited to, antimony lactate, antimony potassium tartrate, or mixtures thereof. Content of the antimony salt, based on the converted amount into the weight of $Sb^{3+}$, may range from 1 gm/L to 100 gm/L or such as from 1 gm/L to 20 gm/L.

One or more surfactants are included in the tin or tin alloy plating composition. At least one surfactant employed in the composition is an alcohol ethoxylate. Suitable alcohol ethoxylates include, but are not limited to, primary alcohol ethoxylates having chain lengths such as from $C_8$ to $C_{22}$ or such as from $C_{12}$ to $C_{16}$. The degree of ethoxylation is such as from 1 to 30 moles of ethoxylation per mole of alcohol or such as from 10 to 25 moles of ethoxylation per mole of alcohol. Other alcohol ethoxylates include ethoxylated bisphenol and ethoxylated beta-naphthol. Such alcohol ethoxylates are included in the compositions of the invention in amounts of from 0.5 gm/L to 10 gm/L or such as from 3 gm/L to 8 gm/L.

Imidazoline compounds also may be included. Examples of suitable imidazoline compounds include, but are not limited to, compounds having the formula:

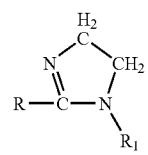

(2)

where R is a fatty acid radical; $R_1$ is hydrogen, hydroxyl or —$C_2H_4$—$CH_2COOM$, —$CH_2$—$COOM$, —$CH_2CH_2COOM$, or —$CH_2$—$CHOHCH_2SO_3M$; M is sodium, potassium or hydrogen or an organic base.

Examples of typical compounds of formula (2) are those in which R contains 6 carbon atoms or more, $R_1$ is —$C_2H_4$—$CH_2COOM$, —$CH_2$—$COOM$ or hydroxyl. Another example of a typical imidazoline suitable for practicing the present invention is where R is $C_7H_{15}$ (capric), $R_1$ is —$C_2H_4OCH_2COONa$, —$CH_2$—$CH_2COONa$, or hydroxyl.

Carboxylic or sulfonic acid-fatty acid imidazolines containing tertiary nitrogens, such as the compound of formula (3), also may be used and the quaternary formed in situ by acid contained in the composition. The compound has the following formula:

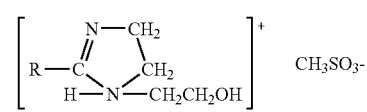

(3)

R is —$C_{12}H_{20}$ (coconut oil). Oleic hydroxyethyl alkyl imidazole and N'cocoyl-N-N'-dimethyl glycine are examples of other suitable imidazoline compounds suitable for practicing the invention. Such imidazoline compounds are employed in amounts such as from 0.05 mL/L to 2 mL/L or such as from 0.1 mL/L to 1 mL/L.

Other suitable imidazoline compounds include open ring imidazoline compounds such as disodium cocoamphopropionate. Such open ring imidazoline compounds are employed in amounts such as 0.05 mL/L to 2 mL/L or such as from 0.1 mL/L to 1 mL/L.

The electroplating tin and tin alloy compositions also include compounds that minimize oxidation of stannous tin. Such compounds include, but are not limited to, aromatic diols such as unsubstituted and substituted benzenediols, naphthalenediols, anthracenediols or mixtures thereof.

Examples of substituents, which may be present on the substituted benzendiols and naphthalenediols, include alkyl or up to 12 carbon atoms, halogen such as chloro, cycloalkyl such as cyclohexyl and aryl such as phenyl. Examples of suitable aromatic diols are 1,2-benzenediol, methyl-1,4-benzendiol, cyclohexyl-1,4-benzendiol, phenyl-1,4-benzenediol, 1,2-naphthalenediol and 1,4-naphthalenediol. Aromatic diols are included in the compositions in amounts such as 0.05 gm/L to 10 gm/L or such as from 0.1 gm/L to 2 gm/L.

Other surfactants may be employed in the tin and tin alloy compositions. Suitable surfactants include those that provide smooth tin and tin alloy deposits.

Conductivity agents also may be included in the electroplating compositions to maintain a suitable current in the compositions during electroplating. Any suitable salt, which is soluble in the compositions diluent, may be employed. Compositions of the invention typically are aqueous. Examples of suitable conductivity agents include, but are not limited to, alkali metal sulfates, such as sodium sulfate, alkali metal alkanesulfonates, such as sodium methane sulfonate, alkali metal chlorides, such as sodium chloride or potassium chloride, ammonium sulfate, sulfuric acid, citric acid, sodium acetate, sodium carbonate, diluent soluble salts of citrates, such as ammonium citrate, lactates, gluconates, such as sodium gluconate, potassium pyrophosphate, or mixtures thereof. Conductivity agents may be employed in amounts such as from 5 gm/L to 300 gm/L or such as from 20 gm/L to 150 gm/L.

Optionally, other components may be added to the compositions such as grain refiners or brighteners. Grain refiners and brighteners are well know in the art and are used in their conventional amounts.

Other optional components include pH adjusters used to maintain a pH of from 1 to 6 or such as from 2 to 4. The pH adjusters are added to reduce any free acid in the electroplating composition by converting such acid to its corresponding salt. Examples of such pH adjusters include alkali hydroxides and ammonia or ammonium salts.

Additional optional adjuvants may be added to the compositions to assist in the effectiveness of the electroplating performance on composite substrates. Such optional adjuvants are well known in the art and are employed in conventional amounts.

An exemplary aqueous tin electroplating composition contains one or more sources of tin; one or more imidazoline compounds; one or more ethoxylated alcohols; malonic acid, salt of malonic acid or mixtures thereof in an amount of from 20 gm/L to 40 gm/L; one or more conductivity agents; and one or more aromatic diols.

An exemplary aqueous tin alloy electroplating composition contains one or more sources of tin; one or more sources of an alloying metal; one or more ethoxylated alcohols; one or more imidazoline compounds; malonic acid, salt of malonic acid or mixtures thereof in an amount of from 20 gm/L to 40 gm/L; one or more conductivity agents; and one or more aromatic diols.

The electroplating compositions may be employed to selectively plate tin or tin alloy on metallized portions of composite substrates. Selective plating within the scope of the present invention means that tin or tin alloy deposits on the metallized portions of the composite substrate without depositing on the non-metallized portions or forms bridges across the non-metallized portions. Additionally, the electroplating compositions do not attack or dissolve ceramic portions of the composite such as to compromise adhesion at an interface between the metallized and ceramic portions of the composite. Surprisingly, compounds having formula (1) in the amounts disclosed above do not compromise adhesion at an interface between metal and non-metal portions of composite materials such as numerous other stabilizing components added to conventional tin and tin alloy electroplating baths. Accordingly, the tin and tin alloy electroplating compositions or baths are an improvement over many conventional electroplating baths. Workers in the art do not have to be concerned that adhesion between metal and non-metal materials may be compromised when depositing tin or tin alloy with the electroplating compositions. Additionally, the tin and tin alloy deposits are smoother than tin and tin alloy deposited by many conventional electroplating baths.

Metals plated with the tin or tin alloys include, but are not limited to, base metals such as copper, copper alloys, nickel, nickel alloys, iron or iron alloys. Silver and silver alloys also may be plated with tin or tin alloy using the electroplating compositions.

Non-metal portions of the composite include ceramic materials composed of various metal oxides, such as lead, aluminum, silicon, zirconium, titanium oxides, barium titanate, natural and synthetic zeolites, or mixtures thereof.

Examples of composite substrates that are plated using the tin or tin alloy compositions include, but are not limited to, leads or electrodes of capacitors such as multilayer chip capacitors (MLCC), inductors, diodes and resistors. Leads or electrodes at the end of the ceramic are terminated or capped with metal or metal alloy pastes. Such metal or metal alloy pastes are well known in the art and are primarily base metal such as copper. The leads or electrodes are base metal electrodes (BME) such as nickel or nickel/copper alloy. Such metal or metal alloy pastes are applied to the leads and fired or sintered onto or into the ceramic. Sintering or firing may be in the range of from 250° C. to 2000° C. Various methods and temperatures may be employed. Methods vary depending on the metal paste and ceramic used. Such methods are well known in the art.

Sintering forms an interface region where the metal of the metal paste and the ceramic are joined. The interface region is a mixture of particles of ceramic material and particles of electrically conducting materials. After the conductive paste is fired, typically a base metal deposit is plated on the conductive paste. Such base metal may be copper, nickel or alloys thereof. The base metal may be deposited on the fired conductive paste by any suitable method known in the art such as electroplating.

After depositing the base metal layer a tin or tin/alloy layer is plated on the base metal. Adhesion at the interface is desirable during electroplating of the tin or tin alloy to form a complete electrical circuit between the tin or tin alloy layer and the composite substrate. Dissociation of the metal and ceramic at the interface region causes an electrical short, which results in a defective capacitor or resistor or other electrical component. Many organic acids employed in tin and tin alloy electroplating compositions cause dissociation of the metal and ceramic at the interface. Surprisingly, the compounds of formula (1) in the amounts disclosed do not cause such undesirable dissociation at the interface to impair the performance of electrical components.

Base metal portions of the composite substrate are contacted for a sufficient time with a tin or tin alloy electroplating composition to form a tin or tin alloy film ranging from 0.01 µm to 20 µm or such as from 0.1 µm to 10 µm or such as from 1 µm to 5 µm. Base metal layers may range in thickness from 0.5 µm to 20 µm, more typically from 5 µm to 100 µm. The electroplating compositions may be applied by vertical application where the composite substrate is immersed in a bath of the electroplating composition, or the electroplating composition may be sprayed on the composite substrate such as in horizontal electroplating. Other examples of electroplating include, but are not limited to, rack plating, barrel plating, and high speed plating such as hoop plating or jet plating.

A cathode current density may be in a range of 0.01 A/dm$^2$ to 100 A/dm$^2$. The range may vary depending on the method used. For example in rack plating the current density may range from 0.5 A/dm$^2$ to 5 A/dm$^2$ or such as from 1 A/dm$^2$ to 3 A/dm$^2$. In barrel plating the current density may range from 0.01 A/dm$^2$ to 1 A/dm$^2$ or such as from 0.1 A/dm$^2$ to 0.5 A/dm$^2$. The anode may be a soluble or an insoluble anode. An example of a soluble anode is a tin electrode. Examples of insoluble anodes are iridium dioxide or platinum dioxide. Other types of soluble and insoluble anodes are suitable. Any suitable power source may be employed to generate an electrical current. Many are well known by those of skill in the art.

Plating temperatures may range from 15° C. to 100° C. or such as from 20° C. to 50° C. The electroplating composition may be stirred. If it is stirred, it is stirred by cathode rocking or liquid fluidization by pumping, anode rotation or by a stirrer.

The following examples are intended to further illustrate embodiments of the invention but are not intended to limit the scope of the invention.

EXAMPLE 1

Comparative Test

Ceramic chip capacitors were obtained to test adhesion between the base metal outer electrode and the ceramic portion of the capacitors after each chip capacitor was soaked in either a tin metal electrolyte containing malonic acid or a tin metal electrolyte containing sodium gluconate.

The external electrode was composed of a copper paste. 10 ceramic chips were plated in an aqueous tin plating bath composed of 32 gm/L of stannous methane sulfonate, 100 gm/L of sodium gluconate, and 100 gm/L of citric acid.

10 ceramic chips were placed in an aqueous tin plating bath composed of 32 gm/L of stannous methane sulfonate, 50 gm/L of sodium gluconate, and 100 gm/L of citric acid. The pH was adjusted to 4 with sodium hydroxide.

30 ceramic ships were placed in an aqueous tin plating bath composed of 20 gm/L of stannous sulfate, 26 gm/L of malonic acid, and 80 gm/L of sodium sulfate. The pH was adjusted to 3 with sodium hydroxide.

30 ceramic chips were tin plated with an aqueous tin plating bath composed of 20 gm/L of stannous sulfate, 53 gm/L of malonic acid, and 80 gm/L of sodium sulfate. The pH was adjusted to 4 with sodium hydroxide.

The parts were agitated in the plating baths for varying times specified below. Bath temperatures were at 25° C.

| Stabilizing Agent | Electroplating Time (Minutes) | Delamination |
|---|---|---|
| 100 gm/L Sodium Gluconate | 60 | 1/10 |
| 50 gm/L Sodium Gluconate | 300 | 10/10 |
| 26 gm/L Malonic Acid | 60 | 0/10 |
| 26 gm/L Malonic Acid | 120 | 0/10 |
| 26 gm/L Malonic Acid | 300 | 0/10 |
| 53 gm/L Malonic Acid | 15 | 0/10 |
| 53 gm/L Malonic Acid | 30 | 0/10 |
| 53 gm/L Malonic Acid | 60 | 0/10 |

After being exposed to the tin plating solution, each chip capacitor was tested for the adhesion of the copper termination portions to the ceramic. The capacitors were rinsed with deionized water then dried at 50° C. in a conventional convection oven. Each capacitor was pressed on to adhesive foam tape with the termination portion adhered to the tape. Each capacitor was then pulled off to see if any of the metal de-adhered.

Ceramic chip capacitors exposed for 60 minutes to the tin plating baths, which contained 100 gm/L sodium gluconate had one delamination of metal from the ceramic at the interface of the copper and the ceramic. All of the ceramic chip capacitors exposed to the tin plating solution with 50 gm/L sodium gluconate for 300 minutes showed delamination at the interface.

In contrast, no delamination at the interface occurred with ceramic chips exposed to the tin plating baths containing malonic acid in amounts of 26 gm/L and 53 gm/L. Accordingly, tin plating baths containing malonic acid in the amounts used were an improvement over tin plating baths containing sodium gluconate.

EXAMPLE 2

Comparative Test

Ceramic chip capacitors having the same composition as those used in Example 1 were soaked in tin electroplating baths containing malonic acid or sodium gluconate. After each ceramic chip capacitor was soaked, the adhesion at the interface between the copper external electrode and the ceramic chip portion of the capacitor was tested.

30 ceramic chip capacitors were exposed to a tin electroplating bath composed of 40 gm/L stannous methyl sulfonate, 100 gm/L sodium methyl sulfonate, and 100 gm/L of sodium gluconate. The pH of the bath was maintained at 4 with sodium hydroxide.

20 ceramic chip capacitors were soaked in a tin electroplating bath composed of 40 gm/L stannous methyl sulfonate, 100 gm/L sodium methyl sulfonate, and 26 gm/L malonic acid. The pH of the bath was maintained at 3 with sodium hydroxide.

The ceramic chip capacitors were placed in the solutions for a period of 15 to 60 minutes. Bath temperatures were 25° C.

After each capacitor was soaked, it was rinsed with deionized water and dried at 50° C. in a conventional convection oven. Each capacitor was then pressed to adhesive foam tape with the electroplated metal portion contacting the tape. The capacitor was then removed from the tape and observed for delamination of the metal from the ceramic at the interface. The results are in the table below.

| Stabilizing Agent | Electroplating Time (Minutes) | Delamination |
|---|---|---|
| 100 gm/L Sodium Gluconate | 15 | 2/10 |
| 100 gm/L Sodium Gluconate | 30 | 2/10 |
| 100 gm/L Sodium Gluconate | 60 | 10/10 |
| 26 gm/L Malonic Acid | 30 | 0/10 |
| 26 gm/L Malonic Acid | 60 | 0/10 |

Two of the ceramic chip capacitors exposed to the tin bath containing sodium gluconate for 15 and 30 minutes delaminated at the copper-ceramic interface. All of the ceramic chip capacitors plated in the tin bath for 60 minutes containing sodium gluconate delaminted.

In contrast, none of the ceramic chip capacitors tin plated in the tin bath containing malonic acid showed any signs of delamination. Accordingly, the tin bath containing malonic acid was an improvement over the tin bath containing sodium gluconate.

EXAMPLE 3

Tin/Silver Alloy Bath

The following aqueous electrolyte is prepared:

| Component | Amount |
| --- | --- |
| Stannous Sulfate | 100 gm/L |
| Silver Nitrate | 11 gm/L |
| Sodium Malonate | 20 gm/L |
| Sodium Sulfate | 85 gm/L |
| Coconut Oil, Carboxylated Imidazoline | 0.5 mL/L |
| $C_{10}$ Ethoxylated Alcohol | 2 gm/L |
| 1,2-benzenediol | 0.3 gm/L |

5 ceramic coupons with copper surfaces are selectively electroplated with the tin/silver electrolyte to provide a tin/silver alloy layer of 2 μm thick on the copper of each coupon. The tin/silver alloy is a tin rich alloy (greater than 50% by weight of tin in the alloy). Each coupon is immersed in the electrolyte for 45 seconds. The temperature of the electrolyte is 30° C. and the cathode current density is 5 A/dm². The pH of the electrolyte is 4 and is maintained at that pH with potassium hydroxide.

The tin/silver alloy layers have a smooth and uniform appearance. No surface defects are noticeable with the naked eye. All of the coupons tested are tested for adhesion between the copper and ceramic interface and no delamination is observable.

EXAMPLE 4

Tin/Bismuth Alloy Bath

The following aqueous electrolyte is prepared:

| Component | Amount |
| --- | --- |
| Stannous Methanesulfonate | 130 gm/L |
| Methanesulfonic Acid | 75 gm/L |
| Bismuth (III) Acetate | 20 gm/L |
| Malonic Acid | 30 gm/L |
| Coconut Oil, Carboxylated Imidazoline | 1 mL/L |
| $C_{10}$ Ethoxylated Alcohol | 1 gm/L |
| 1,2-benzenediol | 0.5 gm/L |

10 barium titanate containing ceramic coupons with a nickel surface are immersed in the tin/bismuth electrolyte for 25 seconds to selectively plate a tin/bismuth layer of 1 μm thick on each nickel surface of each coupon. The tin/bismuth alloy is a tin rich alloy (greater than 50% by weight of tin in the alloy). Cathode current density is 5 A/dm². The anode is an insoluble iridium dioxide electrode. Reciprocal movement of the cathode stirs the electrolyte solution during plating. The temperature of the electrolyte is maintained at 35° C., and the pH of the electrolyte is 3. The pH is maintained using potassium hydroxide.

After electroplating each tin/bismuth plated coupon is removed from the electrolyte, rinsed with deionized water and dried at 80° C. in a conventional convection oven. Each coupon has a uniform, smooth tin/bismuth surface. No irregular surface depressions are noticeable with the naked eye. No delamination at the interface between the nickel and ceramic is observed using the tape test on any of the coupons.

EXAMPLE 5

Tin/Lead Alloy Bath

The following aqueous electrolyte is prepared:

| Component | Amount |
| --- | --- |
| Stannous Chloride Dihydrate | 90 gm/L |
| Sodium Chloride | 90 gm/L |
| Lead Acetate | 20 gm/L |
| Malonic Acid | 20 gm/L |
| Sodium Malonate | 20 gm/L |
| $C_{12}$ Ethoxylated Alcohol | 2 gm/L |
| 1,2-benzenediol | 2 gm/L |
| Coconut Oil, Carboxylated Imidazoline | 0.1 mL/L |

5 ceramic coupons composed of a synthetic zeolite and a layer of copper/nickel alloy are immersed into the tin/lead alloy electrolyte for 2 minutes to selectively deposit a tin/lead film 8 μm thick on the copper/nickel alloy layer. The tin/lead alloy is tin rich (greater than 50% by weight of tin in the alloy). The temperature of the electrolyte is 20° C. with a pH of 2.5, which is maintained with potassium hydroxide. The current density applied is 8 A/dm² and the anode is an iridium dioxide electrode. The electrolyte is stirred throughout plating by use of a magnetic stirrer.

After each coupon is plated with the tin/lead alloy, the coupon is rinsed with deionized water and dried at 90° C. in a conventional convection oven. The tin/lead film is even and bright on all of the coupons. There are no visible surface irregularities or depressions on the tin/lead films.

The tape test is performed on all of the samples using adhesive foam tape. Each coupon is applied to the tape with the metallized portions contacting the tape. Each coupon is removed. None of the coupons show any signs of delamination at the copper/nickel-ceramic interface.

EXAMPLE 6

Tin/lead Alloy Bath

The following aqueous electrolyte is prepared:

| Component | Amount |
| --- | --- |
| Stannous Methane Sulfonate | 105 gm/L |
| Lead Methyl Sulfonate | 15 gm/L |
| Methyl Sulfonic Acid | 50 mL/L |
| Sodium Malonate | 35 gm/L |
| $C_{15}$ Ethoxylated Alcohol | 1 gm/L |
| Coconut Oil, Carboxylated Imidazoline | 2 mL/L |
| Cyclohexyl-1,4-benzenediol | 0.5 gm/L |

15 ceramic coupons containing lead, aluminum and titanium oxides with a surface having an iron layer are electroplated in the tin/lead alloy electrolyte to form a tin rich tin/lead alloy on the iron layer of the ceramic coupons. The tin rich alloy is composed of greater than 80% by weight of tin.

Each ceramic is immersed in the electrolyte for 40 minutes to form a tin/Lead film of 10 μm on the iron portion of each coupon. The temperature of the electrolyte during plating is 30° C. and the pH of the electrolyte is 3. Sodium hydroxide is used to maintain the pH at 3. Cathode current density is 0.5 A/dm² and the anode is a tin/lead electrode.

After each coupon is electroplated it is removed from the electrolyte, rinsed with deionized water and dried in a conventional convection oven at 90° C. Each tin/lead surface is smooth and bright in appearance. No irregular surface features are observable with the naked eye.

Each coupon is then applied to adhesive foam tape with the metallized portions contacting the tape. Each coupon is then removed from the tape. None of the coupons show any signs of delamination at the iron-ceramic interface.

EXAMPLE 7

Tin/Copper Alloy Bath

The following aqueous electrolyte is prepared:

| Component | Amount |
| --- | --- |
| Stannous Sulfate | 30 gm/L |
| Copper Sulfate Pentahydrate | 10 gm/L |
| Sodium Sulfate | 90 gm/L |
| Malonic Acid | 30 gm/L |
| $C_{12}$ Ethoxylated Alcohol | 1 gm/L |
| Coconut Oil, Carboxylated Imidazoline | 0.2 mL/L |
| 1,2-naphthalenediol | 0.3 gm/L |

15 zirconium containing ceramic coupons with a layer of silver on one of the surfaces are selectively plated with a film of tin/copper alloy having a thickness of 3 μm using the tin/copper electrolyte. The tin/copper alloy is tin rich (greater than 60% by weight of tin in the alloy).

Plating is performed for 4 minutes at a temperature of 30° C. The pH of the electrolyte is maintained at 3.5 with sodium hydroxide. Cathode current density is 15 A/dm² and the anode is a rotating insoluble lead dioxide electrode.

After each coupon is plated it is removed from the electrolyte and rinsed with deionized water and dried in a conventional convection oven at 85° C. Each coupon has a smooth, uniform tin/copper film. Also, none of the coupons show any signs of delamination when tested for adhesion using the tape test.

EXAMPLE 8

Tin/Indium Alloy Bath

The following aqueous electrolyte is prepared:

| Component | Amount |
| --- | --- |
| Stannous Methanesulfonate | 190 gm/L |
| Indium Methanesulfonate | 10 gm/L |
| Methane Sulfonic Acid | 60 mL/L |
| Sodium Malonate | 20 gm/L |
| Glutaric Acid | 20 gm/L |
| Oleic Hydroxyethyl Alkyl Imidazoline | 0.5 mL/L |
| Ethoxylated beta-naphthol | 2 gm/L |
| 1,2-benzenediol | 0.1 gm/L |

5 silicon containing ceramic coupons with a nickel layer are selectively electroplated with the tin/indium electrolyte to form a tin rich tin/indium film having a thickness of 5 μm on the nickel layer of each coupon. The tin rich alloy contains greater than 60% by weight of tin.

Each coupon is immersed in the electrolyte and plated for 1 minute at a temperature of 45° C. The pH of the electrolyte is maintained at 4 with potassium hydroxide. Cathode current density is 10 A/dm² and the anode is an insoluble iridium dioxide rotating electrode. Rotation of the electrode during plating stirs the electrolyte.

After each coupon is plated with the tin/indium alloy, the coupons are rinsed with deionized water and dried at 80° C. in a conventional convection oven. Each coupon had a smooth tin/indium film without any irregular surface deformations. The tin/indium film appears uniform on each of the coupons. No delamination occurs when the coupons are tested for adhesion using the tape test.

EXAMPLE 9

Tin/Antimony Alloy Bath

The following aqueous electrolyte is prepared:

| Component | Amount |
| --- | --- |
| Stannous Chloride Dihydrate | 80 gm/L |
| Sodium Chloride | 105 gm/L |
| Antimony Lactate | 15 gm/L |
| Malonic Acid | 20 gm/L |
| Glutaric Acid | 15 gm/L |
| Methyl-1,4-benzenediol | 0.2 gm/L |
| Ethoxylated bis-phenol | 5 gm/L |
| N'cocoyl-N-N'dimethyl glycine | 0.1 mL/L |

5 tin oxide containing ceramic coupons with a nickel/tin alloy layer are selectively plated with a tin/antimony film having a thickness of 1 μm using the electrolyte in the table. The tin/antimony film is tin rich (greater than 55% by weight of the alloy is tin). Each coupon is plated for 1 minute at a temperature of 21° C. The pH of the electrolyte is maintained at 2 using sodium hydroxide. Cathode current density is at 4 A/dm² and the anode is an iridium dioxide insoluble electrode. The anode rotates to maintain constant stirring of the electrolyte during plating.

Each coupon is removed from the electrolyte after a tin/antimony film of 1 μm of tin/antimony is deposited on the nickel/tin layer. Each coupon is rinsed with deionized water and dried at 80° C. in a conventional convection oven. Each coupon shows a smooth tin/antimony film with no signs of irregular surface defects. Also, there are no signs of delamination at the interface between the nickel/tin layer and the ceramic when the coupons are tested using the tape test.

EXAMPLE 10

Tin Bath

The following aqueous electrolyte is prepared:

| Component | Amount |
| --- | --- |
| Stannous Sulfate | 15 gm/L |
| Sodium Sulfate | 85 gm/L |
| Malonic Acid | 25 gm/L |
| $C_{12}$ Ethoxylated Alcohol | 1.5 gm/L |
| 1,2-benzenediol | 0.3 gm/L |
| Coconut oil, Carboxylated Imidazoline | 0.2 mL/L |

10 lead oxide and titanium oxide containing ceramic coupons with a copper layer are selectively electroplated with a tin film having a thickness of 4 μm using the tin electrolyte in the table.

Each coupon is immersed into the tin bath and plated for 40 minutes. The temperature of the bath is 40° C. and the pH is 4. The pH is adjusted with sodium hydroxide. The cathode current density is 0.2 A/dm² and the anode is an iridium dioxide insoluble electrode. The rotation of the cathode parts in a barrel during plating maintains a uniform distribution of bath components and a constant bath temperature.

After plating each coupon is removed from the bath and rinsed with deionized water then dried in a conventional convection oven at 50° C. Each coupon has a smooth, uniform tin film on the copper layer. Each coupon is then tested for adhesion of the copper to the ceramic at the interface using the tape test. No signs of delamination at the interface are observable.

EXAMPLE 11

Tin Bath

The following aqueous electrolyte is prepared:

| Component | Amount |
| --- | --- |
| Stannous Sulfate | 20 gm/L |
| Sodium Sulfate | 95 gm/L |
| Sodium Malonate | 30 gm/L |
| $C_{15}$ Ethoxylated Alcohol | 2 gm/L |
| Coconut, Carboxylated Imidazoline | 0.1 mL/L |
| Phenyl-1,4-benzenediol | 0.4 gm/L |

14 silicon containing ceramic coupons with a copper/nickel alloy layer are plated with a film of tin having a thickness of 0.5 μm using the bath in the table. Plating is done over 1 minute at a temperature of 35° C. and at a pH of 2. The pH is maintained using sodium hydroxide. Cathode current density is at 1 A/dm² and the anode is a rotating iridium dioxide electrode.

After plating is completed each coupon is removed from the bath, rinsed with deionized water and dried in a conventional convection oven at 50° C. The tin film on each of the coupons is smooth and uniform. No irregular surface features or depressions are observable. No delamination occurs between the copper/nickel-ceramic interface during the tape test.

What is claimed is:

1. A composition consisting essentially of one or more sources of tin, the source of tin consists of stannous organic sulfonate, stannous sulfate, stannous gluconate, stannous citrate, stannous lactate, stannous halide or mixtures thereof; at least one surfactant which is an alcohol ethoxylate; one or more aromatic diols; one or more conductivity agents, the conductivity agents consist of alkali metal sulfates, alkali metal alkanesulfonates, alkali metal chlorides, ammonium sulfate, sulfuric acid, citric acid, sodium acetate, sodium carbonate, diluent soluble salts of citrates, lactates, and gluconates, and potassium pyrophosphate; and one or more compounds having a general formula:

HOOCBCOOH   (1)

where B is a chemical bond or is —$(CH_2)_n$— and n is an integer of from 1 to 4, a salt of the compound or an ester thereof, the compound, salt or ester thereof is in an amount of from 15 gm/L to 55 gm/L.

2. The composition of claim 1, wherein the alcohol ethoxylate has chain lengths of $C_8$ to $C_{22}$ and ethoxylation is from 1 to 30 moles per mole of alcohol.

3. The composition of claim 1, wherein the pH of the composition ranges from 1 to 6.

4. The composition of claim 1, further consisting essentially of one or more imidazoline compounds.

5. The composition of claim 1, wherein the compound of formula (1) is malonic acid, glutaric acid or salts thereof.

6. The composition of ciaim 1, wherein the aromatic diols are 1,2-benzenediol, methyl-1,4-benzenediol, cyclohexyl-1,4-benzenediol, phenyl-1,4-benzenediol, 1,2-naphthalenediol, 1,4-naphthalenediol or mixtures thereof.

7. The composition of claim 1, wherein the aromatic diols are in amounts of 0.05 gm/L to 10 gm/L.

8. The composition of claim 7, wherein the aromatic diols are in amounts of 0.1 gm/L to 2 gm/L.

9. The composition of claim 1, wherein the conductivity agents are alkali metal sulfates.

10. The composition of claim 1, wherein the compound, salt or ester thereof of general formula (1) ranges from 20 g/L to 45 g/L.

11. The composition of claim 1, wherein the composition has a pH of 2 to 4.

12. A method comprising:
a) contacting a composite substrate with a composition consisting essentially of one or more sources of tin, the source of tin consists of stannous organic sulfonate, stannous sulfate, stannous gluconate, stannous citrate, stannous lactate, or stannous halide; one or more aromatic diols; one or more conductivity agents, the conductivity agents consist of alkali metal sulfates, alkali metal alkanesulfonates, alkali metal chlorides, ammonium sulfate, sulfuric acid, citric acid, sodium acetate, sodium carbonate, diluent soluble salts of citrates, lactates, and gluconates, and potassium pyrophosphate; and at least one surfactant which is an alcohol ethoxylate; arid one or more compounds having a general formula:

HOOCBCOOH   (1)

where B is a chemical bond or is —$(CH_2)_n$— and n is an integer of from 1 to 4, a salt or ester thereof the compound, salt or ester thereof is in an amount of from 15 gm/L to 55 gm/L; and
b) generating an electrical current through the composition to selectively deposit a tin or tin alloy film on a metal portion of the composite substrate.

13. The method of claim 12, wherein a non-metal portion of the composite substrate is a ceramic.

14. The method of claim 12, wherein the compound of formula (1) is malonic acid, glutaric acid or salts thereof.

15. A method comprising coating a base metal electrode of a composite substrate with a conductive paste; firing the conductive paste; electroplating a base metal or base metal alloy on the fired conductive paste; and electroplating a tin or tin alloy on the base metal or base metal alloy using a tin or tin alloy composition consisting essentially of one or more sources of tin, the source of tin consists of stannous organic sulfonate, stannous sulfate, stannous gluconate, stannous citrate, stannous lactate, stannous halide or mixtures thereof; at least one surfactant which is an alcohol ethoxylate; one or more aromatic diols; one or more conductivity agents, the conductivity agents consist of alkali metal sulfates, alkali metal alkanesulfonates, alkali metal chlorides, ammonium sulfate, sulfuric acid, citric acid, sodium acetate, sodium carbonate, diluent soluble salts or citrates, lactates, and gluconates, and potassium pyrophosphate; and one or more compounds having a formula:

 (1)

where B is a chemical bond or $(-CH_2-)_n$ and n is an integer of from 1 to 4, a salt of the compound or an ester thereof, the compound, salt or ester thereof is in an amount of from 15 gm/L to 55 gm/L.

16. The method of claim 15, wherein the tin or tin alloy composition further consisting essentially of an imidazoline compound.

* * * * *